United States Patent
Zhang et al.

(10) Patent No.: US 7,079,426 B2
(45) Date of Patent: Jul. 18, 2006

(54) DYNAMIC MULTI-VCC SCHEME FOR SRAM CELL STABILITY CONTROL

(75) Inventors: Kevin Zhang, Portland, OR (US); Fatih Hamzaoglu, Hillsboro, OR (US); Lin Ma, West Orange, NJ (US)

(73) Assignee: Intel Corporation, Santa Clara, CA (US)

( * ) Notice: Subject to any disclaimer, the term of this patent is extended or adjusted under 35 U.S.C. 154(b) by 113 days.

(21) Appl. No.: 10/950,740

(22) Filed: Sep. 27, 2004

(65) Prior Publication Data

US 2006/0067134 A1    Mar. 30, 2006

(51) Int. Cl.
G11C 7/00  (2006.01)
G11C 8/00  (2006.01)

(52) U.S. Cl. ............... 365/189.02; 365/230.02; 365/226

(58) Field of Classification Search .......... 365/154, 365/156, 226, 230.06, 189.02, 230.02, 210
See application file for complete search history.

(56) References Cited

U.S. PATENT DOCUMENTS

| | | | |
|---|---|---|---|
| 5,923,582 A * | 7/1999 | Voss | 365/154 |
| 6,181,608 B1 | 1/2001 | Keshavarzi et al. | |
| 6,292,401 B1 | 9/2001 | Zhang et al. | |
| 6,442,089 B1 | 8/2002 | Fletcher et al. | |
| 6,483,375 B1 | 11/2002 | Zhang et al. | |
| 6,519,176 B1 | 2/2003 | Hamzaoglu et al. | |
| 6,556,471 B1 | 4/2003 | Chappell et al. | |
| 6,560,139 B1 | 5/2003 | Ma et al. | |
| 6,608,786 B1 | 8/2003 | Somasekhar et al. | |
| 6,621,726 B1 | 9/2003 | Zhang et al. | |
| 6,650,171 B1 | 11/2003 | Zhang et al. | |
| 6,724,648 B1 * | 4/2004 | Khellah et al. | 365/154 |
| 6,775,181 B1 | 8/2004 | Zhang et al. | |
| 6,795,332 B1 * | 9/2004 | Yamaoka et al. | 365/154 |
| 6,801,465 B1 | 10/2004 | Somasekhar et al. | |
| 6,891,745 B1 * | 5/2005 | Liaw | 365/154 |

* cited by examiner

*Primary Examiner*—Trong Phan
(74) *Attorney, Agent, or Firm*—Carrie A. Boone, P.C.

(57) ABSTRACT

A dynamic multi-voltage memory array features SRAM cells that are subjected to different biasing conditions, depending on the operating mode of the cells. The selected SRAM cell receives a first voltage when a read operation is performed, and receives a second voltage when a write operation is performed. By biasing the cell differently for the two distinct operations, a total decoupling of the read and write operations is achieved. The disclosed memory array, as well as future SRAM designs incorporating the multi-voltage capability thus avoid the conflicting requirements of read and write operations. Random single-bit failures of the memory array are reduced, due to the improvement in read stability and write margin.

20 Claims, 7 Drawing Sheets

US 7,079,426 B2

DYNAMIC MULTI-VCC SCHEME FOR SRAM CELL STABILITY CONTROL

FIELD OF THE INVENTION

This invention relates to SRAM technology and, more particularly, to an optimized SRAM design employing different biasing conditions for read and write operations.

BACKGROUND OF THE INVENTION

Processor-based systems rely on memory devices to store data so that the processor can access and manipulate the data. Memory devices include non-volatile media, such as read-only memory (ROM), hard disk drives and compact disk (CD) ROM drives, as well as volatile media, known as random access memory (RAM). The RAM is directly accessible by the processor. Thus, data stored on the hard disk drive is loaded into RAM before processing can begin.

A processor-based system, such as a personal computer, may include more than one type of RAM. Dynamic RAM, or DRAM, is typically used as the computer's main memory because of its low cost and high density (i.e., megabits per chip). Each cell in a DRAM includes a single transistor and a capacitor for storing the cell state (either a "1" value or a "0" value). The DRAM cells must be refreshed periodically in order to maintain the cell state.

Static RAM, or SRAM, stores data in a flip-flop. SRAM cells usually include four to six transistors. Because SRAM cells need not be refreshed, they operate at faster speeds than DRAM cells. However, SRAM cells take up more space and are more expensive. SRAM cells are typically used for level-one and level-two caches within the processor-based system.

High-performance very large scale integration (VLSI) systems employ large amounts of on-die SRAM for the cache function. As scaling of such technologies continues, particular attention is given to the performance of the SRAM as well as its die size. Since the SRAM cell supports both read and write operations, its performance is measured by its read stability and its write margin. The performance criteria coupled with the need to maintain a small cell area are particularly challenging for any new SRAM design.

The read stability and the write margin make conflicting demands on the SRAM cell. During a read operation, the SRAM cell preferably has "weak disturbance" at the internal storage nodes in order to avoid being erroneously flipped (from a "1" state to a "0" state, and vice-versa). This is preferred whether a "true read," in which the contents of the cell are sent to read/write circuitry, or a so-called "dummy read," in which the read is not actually processed, takes place. During a write operation, the SRAM cell preferably has "strong disturbance" in order to successfully flip the cell. Thus, read stability depends on weak disturbance within the SRAM cell while write margin depends on strong disturbance within the same SRAM cell.

The apparent paradox between read and write requirements has made SRAM cell scaling extremely difficult. For the current generation of SRAM memory, cell scaling is limited by both the read and write operations. Thus, future implementations of SRAM memories, using the current technology, are not expected to show improvements in read stability and write margin, nor are cell sizes expected to be made smaller, due to the conflicting performance requirements of reads and writes.

Thus, there is a continuing need to design an SRAM memory cell that meets both the read stability and the write margin requirements, while a minimum cell area is maintained.

DETAILED DESCRIPTION

In accordance with the embodiments described herein, a dynamic multi-voltage method and memory array are introduced, in which an SRAM memory cell is put under different biasing conditions, depending on the operating mode of the cell. A first cell in the memory array is supplied with a first voltage (for a read operation) while a second sell is simultaneously supplied with a second voltage (for a write operation). By biasing the cell differently for the two distinct operations, a total decoupling of the read and write operations is achieved. The disclosed memory array, as well as future SRAM designs incorporating the disclosed multi-voltage capability thus avoid the conflicting performance requirements of read and write operations. In some embodiments, systems using the dynamic multi-voltage memory array experience a reduction in random single-bit failures due to the improvement in read stability and write margin.

In the following detailed description, reference is made to the accompanying drawings, which show by way of illustration specific embodiments in which the invention may be practiced. For example, a six-transistor SRAM memory cell is depicted in the following examples. However, it is to be understood that other embodiments will become apparent to those of ordinary skill in the art upon reading this disclosure. The following detailed description is, therefore, not to be construed in a limiting sense, as the scope of the present invention is defined by the claims.

Figure 1A:
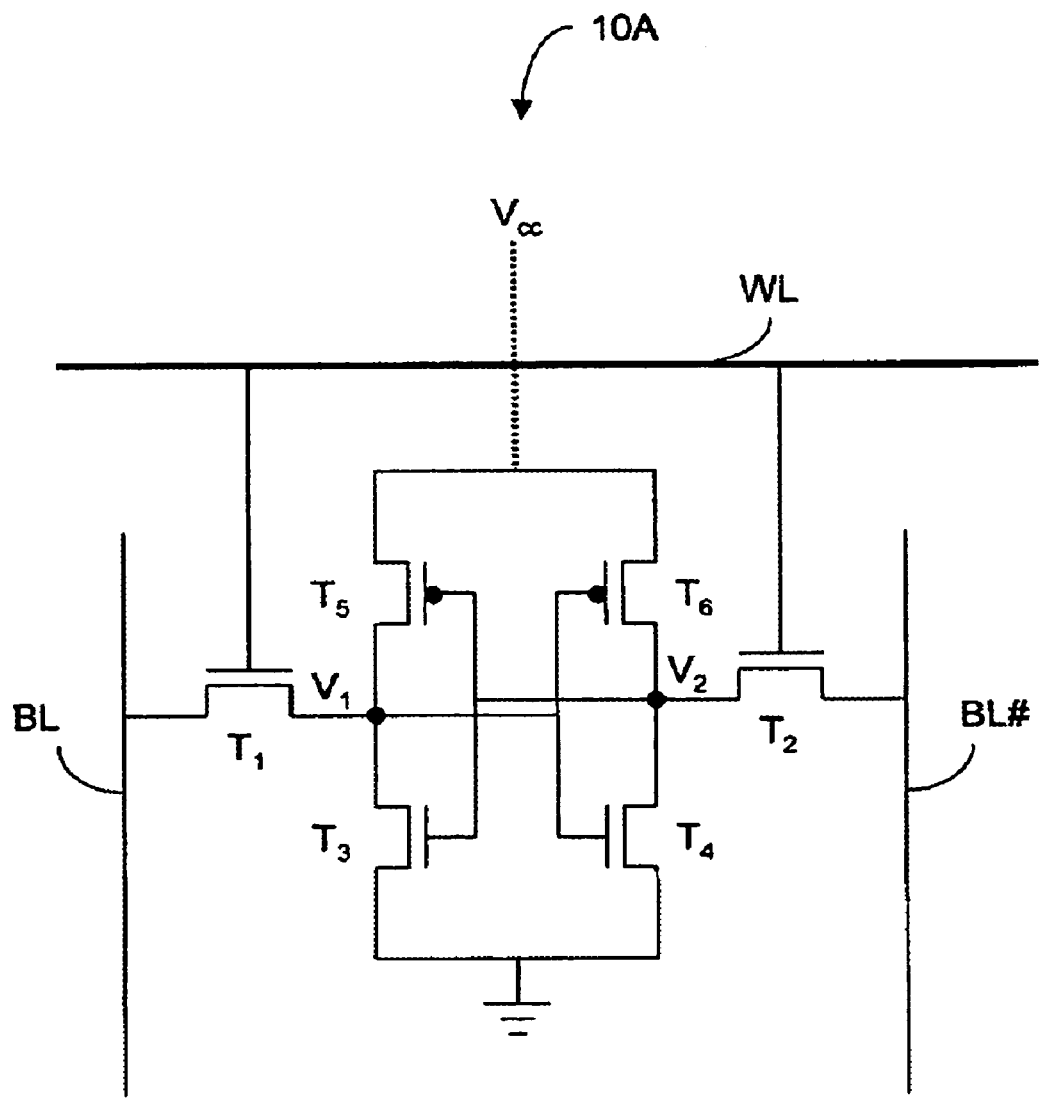
FIG. 1A is a block diagram of a 6T SRAM cell, according to the prior art.
Figure 1B:
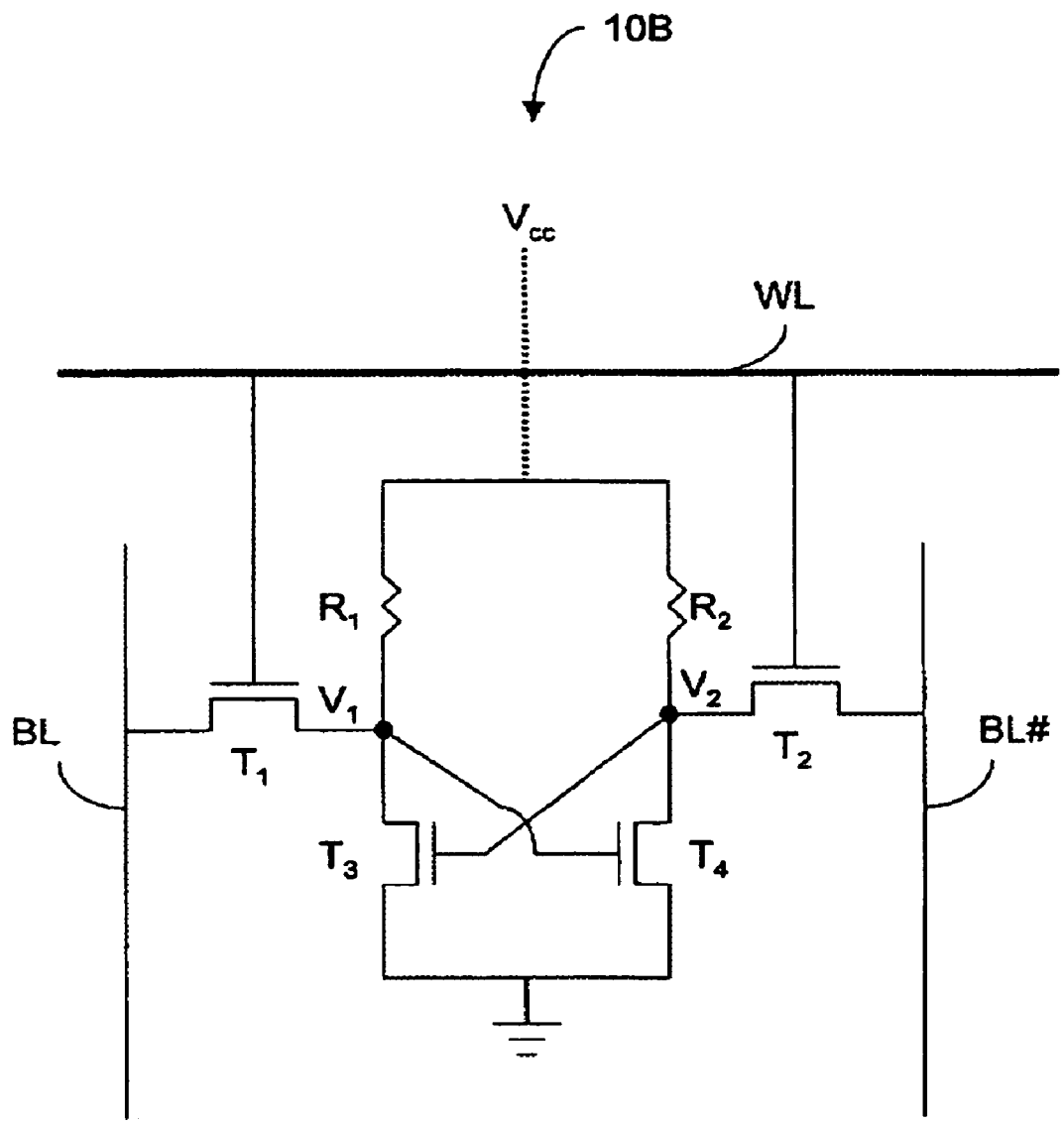
FIG. 1B is a block diagram of a 4T SRAM cell, according to the prior art.
Figure 2:
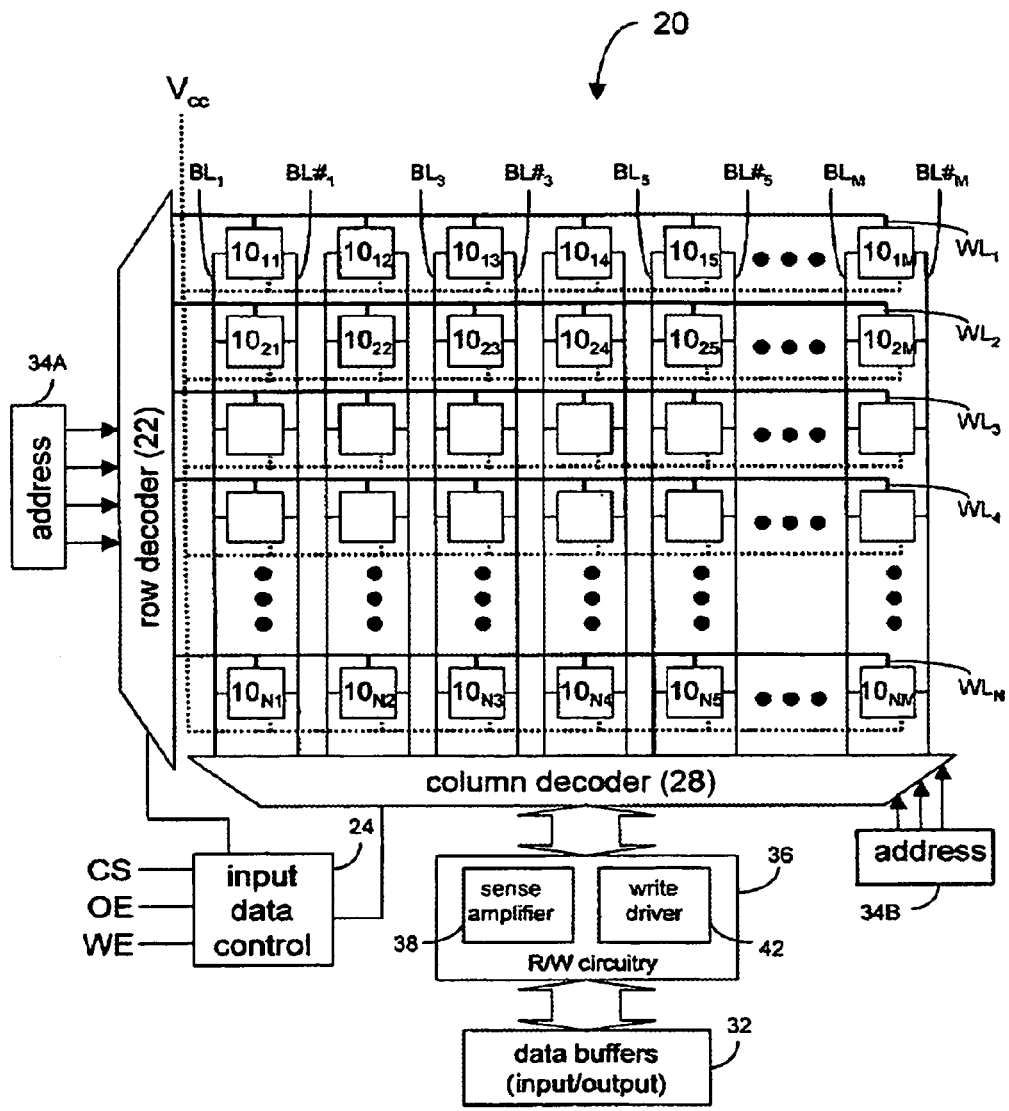
FIG. 2 is a block diagram of a memory array, including either the 6T SRAM cell of FIG. 1A or the 4T SRAM cell of FIG. 1B, according to the prior art.

With respect to FIGS. 1A, 1B, and 2, SRAM memory cells 10A, 10B, and a memory array 20, respectively, are depicted, according to the prior art. In FIG. 1A, a six-transistor (6T) SRAM memory cell 10A is depicted. The SRAM cell 10A may be part of the memory array 20 of FIG. 2, which includes many cells typically arranged in an N×M matrix comprising N M-bit words. The cell 10A includes six transistors, $T_1$–$T_6$, configured as shown in FIG. 1A. The transistors $T_1$–$T_6$ are metal oxide semiconductor field effect (MOSFET) transistors, each including three terminals: a source terminal, a drain terminal, and a gate terminal. Transistors $T_1$, $T_2$, $T_3$, and $T_4$ are N-type MOSFETs, or NMOS transistors, while transistors $T_5$ and $T_6$ are P-type MOSFETs, or PMOS transistors.

A supply voltage $V_{CC}$ is connected to the source terminals of transistors $T_5$ and $T_6$. Transistors $T_5$ and $T_6$ control the flow of current to transistors $T_3$ and $T_4$ of the SRAM cell 10A. Transistors $T_5$ and $T_6$ are referred to herein as pull-up transistors, or $T_U$, of the SRAM cell 10A. The PMOS transistors $T_U$ may additionally include a fourth terminal, bulk (not shown), which may be tied to the source terminal of its respective transistor.

The source terminals of transistors $T_3$ and $T_4$ are connected to ground. Transistors $T_3$ and $T_4$ are referred to herein as pull-down transistors, or $T_D$, of the SRAM cell 10A. The drain terminals of transistors $T_5$ and $T_6$, the pull-up transistors, are coupled to the drain terminals of transistors $T_3$ and $T_4$, the pull-down transistors. The transistors $T_3$, $T_4$, $T_5$, and $T_6$ are logically identical to two back-to-back inverters.

An alternative SRAM memory cell 10B is depicted in FIG. 1B, also according to the prior art. Known as a 4T SRAM cell, the cell 10B includes four transistors, as the PMOS transistors have been replaced with resistors $R_1$ and $R_2$. Since either the 6T SRAM cell 10A or the 4T SRAM cell 10B may be part of the memory array 20, the cells of FIG. 2 are referred to herein as SRAM cells 10.

A horizontal wordline, WL, is connected to the gate terminals of transistors $T_1$ and $T_2$. The source (or drain) terminal of transistor $T_1$ is connected to bitline BL while the source (or drain) terminal of transistor $T_2$ is connected to bitline BL#. (Bitlines BL and BL# are known as complementary bitlines, since one bitline transmits a "1" or "0" value while the other bitline transmits its complement, "0" or "1".) Transistors $T_1$ and $T_2$ are turned on by the activation of wordline WL, allowing access between the bitlines BL/BL# and the rest of the cell 10A or 10B. Transistors $T_1$ and $T_2$ may thus be referred to as the access transistors, or $T_A$, of the SRAM cell 10.

The access transistors $T_1$ and $T_2$, when enabled, couple the bitlines BL and BL# to the complementary cell values, designated as $V_1$ and $V_2$ in FIGS. 1A and 1B. The SRAM cell value $V_1$ is stored on one side of the cell (drain terminals of $T_3$ and $T_5$) and the complement of the cell value $V_2$ is stored on the other side of the cell (drain terminals of $T_4$ and $T_6$). Transistors $T_3$ and $T_4$ are feedback-coupled transistors, in which the drain terminal of transistor $T_3$ is coupled to the gate terminal of transistor $T_4$ while the drain terminal of transistor $T_4$ is coupled to the gate terminal of transistor $T_3$. Thus, the SRAM cell 10A (FIG. 1A) includes two pull-up transistors $T_U$ ($T_5$ and $T_6$), two access transistors $T_A$ ($T_1$ and $T_2$), and two pull-down transistors $T_D$ ($T_3$ and $T_4$) while the SRAM cell 10B (FIG. 1B) includes two resistors ($R_1$ and $R_2$), two access transistors $T_A$ ($T_1$ and $T_2$), and two pull-down transistors $T_D$ ($T_3$ and $T_4$).

In FIG. 2, the SRAM cells 10 of a typical SRAM memory array 20 are arranged in an N×M matrix, with N cells in each column and M cells in each row. Each row corresponds to an M-bit word while the ith column corresponds to the ith bit of each word, where $1 \leq i \leq M$.

Each cell 10 in the matrix is coupled to a wordline and two bitlines, as shown. N wordlines $WL_1$–$WL_N$ are connected to a row decoder 22. The row decoder 22 decodes a row address signal (address 34A) and activates the corresponding wordline $WL_j$, where $1 \leq j \leq N$, for either a read or a write operation. Accordingly, the wordline $WL_j$ activates M cells 10 along the corresponding row of the memory array 20. Thus, when the wordline $WL_2$ is activated, SRAM cells $10_{21}$, $10_{22}$, $10_{23}$, $10_{24}$, $10_{25}$, ... $10_{2M}$ are simultaneously accessible for read or write operations. Within each SRAM cell, the wordline activates the access transistors $T_1$ and $T_2$, which connects the corresponding bitlines BL and BL# to the internal storage of the cell.

The cell matrix of the memory array 20 further includes 2M bitlines, $BL_i$ and $BL\#_i$, where $1 \leq i \leq M$; thus, there are two complementary bitlines for each column of cells. The column decoder 28 decodes a column address signal (address 34B) and activates the corresponding BL/BL# pair. The bitline pairs are selectively connected to read/write (R/W) circuitry 36, including a sense amplifier 38 (for read operations) and a write driver 42 (for write operations). Column-based interleaving, described below, selects which column is to be connected to the R/W circuitry 36.

When a read is being performed, the value stored in the cell 10 is sent to the bitline BL while the complement of the value is sent to bitline BL#. When a write is being performed, the value to be stored is sent to the bitline BL, while the complement value is sent to the bitline BL#.

Data input/output (I/O) buffers 32 are connected to the R/W circuitry 36. During a read operation, the column decoder 28 receives the data from the relevant bitline pair and sends the data to the sense amplifier 38, which amplifies the signal and sends it to the data I/O (output) buffers 32, for receipt by external circuitry (not shown). During a write operation, the write driver 42 retrieves data from the data I/O (input) buffers 32 and sends the data to the relevant bitline pair corresponding to the column address signal, as selected by the column address decoder 28.

The memory array 20 further depicts an input data control 24, which receives a chip select (CS) signal, an output enable (OE) signal, and a write enable (WE) signal. Because the memory array 20 may actually include a number of distinct SRAM chips, the chip select signal selects the particular SRAM chip to be read from or written to. The output enable signal enables the data I/O buffers 32, allowing data to be transferred to/from the SRAM cell 10. The write enable signal selects whether a read operation or a write operation is taking place. These three signals are sent to the row decoder 22 and the column decoder 28 during every read and write operation.

As previously stated, there exists a paradox in the design of the SRAM cell 10, wherein the read stability and write margin performance requirements are in conflict. The examples given herein refer to the 6T SRAM cell 10A (FIG. 1A); nevertheless, the principles apply to other SRAM cells, such as the 4T SRAM cell 10B (FIG. 1B). In general, the higher the ratio between the pull-down transistor $T_D$ strength and the access transistor strength $T_A$, the better the read stability of the SRAM cell 10. This can be stated as follows:

$$\text{read stability} \rightarrow \text{higher } T_D/T_A \quad (1)$$

For write stability, the test is different. The lower the ratio between the pull-up transistor $T_U$ (or resistor) strength and the access transistor $T_A$ strength, the better the write margin of the SRAM cell 10. This assertion can be stated as follows:

$$\text{write margin} \rightarrow \text{lower } T_U/T_A \quad (2)$$

Thus, in general, with a stronger $T_U$, the read stability is improved, but the write margin is diminished. Since increasing the supply voltage $V_{CC}$ to the SRAM cell 10 improves both the pull-up transistor $T_U$ strength and the pull-down transistor $T_D$ strength, a high cell $V_{CC}$ during a read operation can improve the read stability. By contrast, lowering the supply voltage $V_{CC}$ to the SRAM cell 10 during a write operation weakens both the pull-up transistor $T_U$ strength and the pull-down transistor $T_D$ strength, which increases the cell write margin. Thus, a higher supply voltage improves performance of the read operation while a lower supply voltage improves the performance of the write operation, for any cell 10 in the memory array 20.

To further complicate matters, SRAM design typically involves an interleaving scheme commonly known as column interleaving, in which multiple columns of SRAM cells share the same read/write circuits while being connected to the same wordline. In other words, a single sense amplifier and a single write driver may simultaneously support multiple columns of the memory array.

To support column interleaving, the column decoder 28 typically includes a multiplexer, or MUX, for arbitrating which column of SRAM cells, in a group of SRAM cell columns, is selected for performing the read or write operation. The group size is typically four, eight, or sixteen columns, but may include any number of columns. Thus, in 16:1 column interleaving, one sense amplifier and one write driver are shared for sixteen columns of cells.

Figure 3:
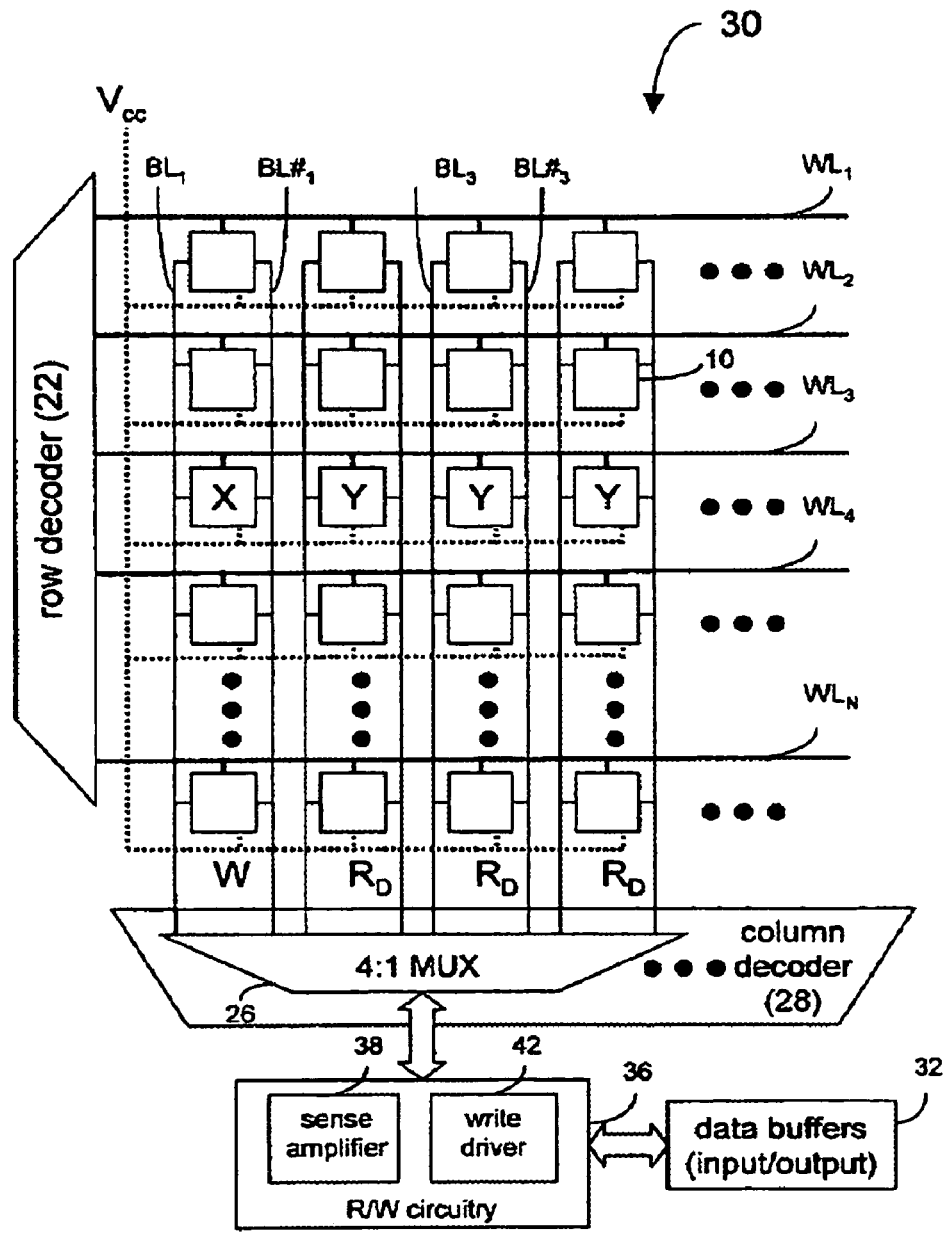
FIG. 3 is a block diagram of a memory array employing 4:1 column interleaving, according to the prior art.

FIG. 3 depicts a portion of a memory array 30 in which 4:1 column interleaving is employed, according to the prior art. The memory array 30 includes a plurality of SRAM cells 10 arranged in a matrix. The column decoder 28 includes a 4:1 multiplexer (MUX) 26, also known as an interleaving MUX, which connects to the complementary bitlines BL/BL# of the first four columns of the matrix. (Although not shown, every four columns of the array are similarly driven by a 4:1 interleaving MUX.) The 4:1 MUX 26 selects which of the four columns is to be read from or written to, and connects the corresponding bitline pairs to read/write (R/W) circuitry 36.

Assuming a write operation is to be performed on the SRAM cell marked with an "X" in FIG. 3, the row decoder (not shown) activates the wordline $WL_3$. The access transistors $T_A$ for each SRAM cell 10 connected to the wordline $WL_3$ are thus turned on, which allows write (or read) operations to be performed using the activated cells. However, the 4:1 MUX 26 within the column decoder 28 selects only the first column for the write operation. Thus, the write driver 2 of the read/write circuitry 36 is only connected to the bitline pair $BL_1/BL\#_1$. The result is that only the SRAM cell 10 marked with an "X" can be written to.

The other SRAM cells in the row (marked with a "Y") are not written to because the 4:1 MUX prevents the write driver 42 from getting access to their bitline pairs ($BL_2/BL\#_2$, $BL_3/BL\#_3$, and $BL_4/BL\#_4$). Instead, the "Y" SRAM cells are said to be "dummy read," since the wordline $WL_3$ is activated for those cells. Of course, the cells which are "dummy read" are not further processed, besides having been activated, since the sense amplifier 38 is not activated to transfer their values to the data I/O buffers 32. Other SRAM cells 10 along the wordline WL3 are similarly accessed via dedicated 4:1 MUXs, one for every four SRAM cells. Because of column interleaving, different SRAM cells 10 connected to the wordline $WL_3$ simultaneously experience different operating modes: a write operation to one cell and a dummy read operation from three cells.

The supply voltage $V_{CC}$ is delivered to each cell 10 within the memory array 20 (FIG. 2) or the memory array 30 (FIG. 3). Recall that the supply voltage $V_{CC}$ is connected to the source terminals of transistors $T_5$ and $T_6$, the pull-up transistors (FIG. 1A) or to the resistors $R_1$ and $R_2$ (FIG. 1B). When $V_{CC}$ is high and the wordline supply voltage is low, read stability is improved within the cell. When $V_{CC}$ is low and the wordline supply voltage is high, the write margin of the cell is improved. (However, when the supply voltage $V_{CC}$ and the wordline supply voltage are the same, no improvement in the write margin or in the read stability are expected.)

In the prior art, attempts have been made to address the read stability/write margin paradox. In U.S. Pat. No. 6,556,471, entitled, "VDD MODULATED SRAM FOR HIGHLY SCALED, HIGH PERFORMANCE CACHE", for example, a method is described in which a lower supply voltage is provided to the activated row during write operations. As described above, a dummy read of the SRAM cells not selected by the interleaving MUX takes place. The read stability of the unselected SRAM cells is degraded, since the supply voltage to the SRAM cells is lowered. Thus, even though no processing of the unselected SRAM cells takes place, by lowering the supply voltage, the contents of the SRAM cells may erroneously change during subsequent "true" reads of the cells.

Figure 4:
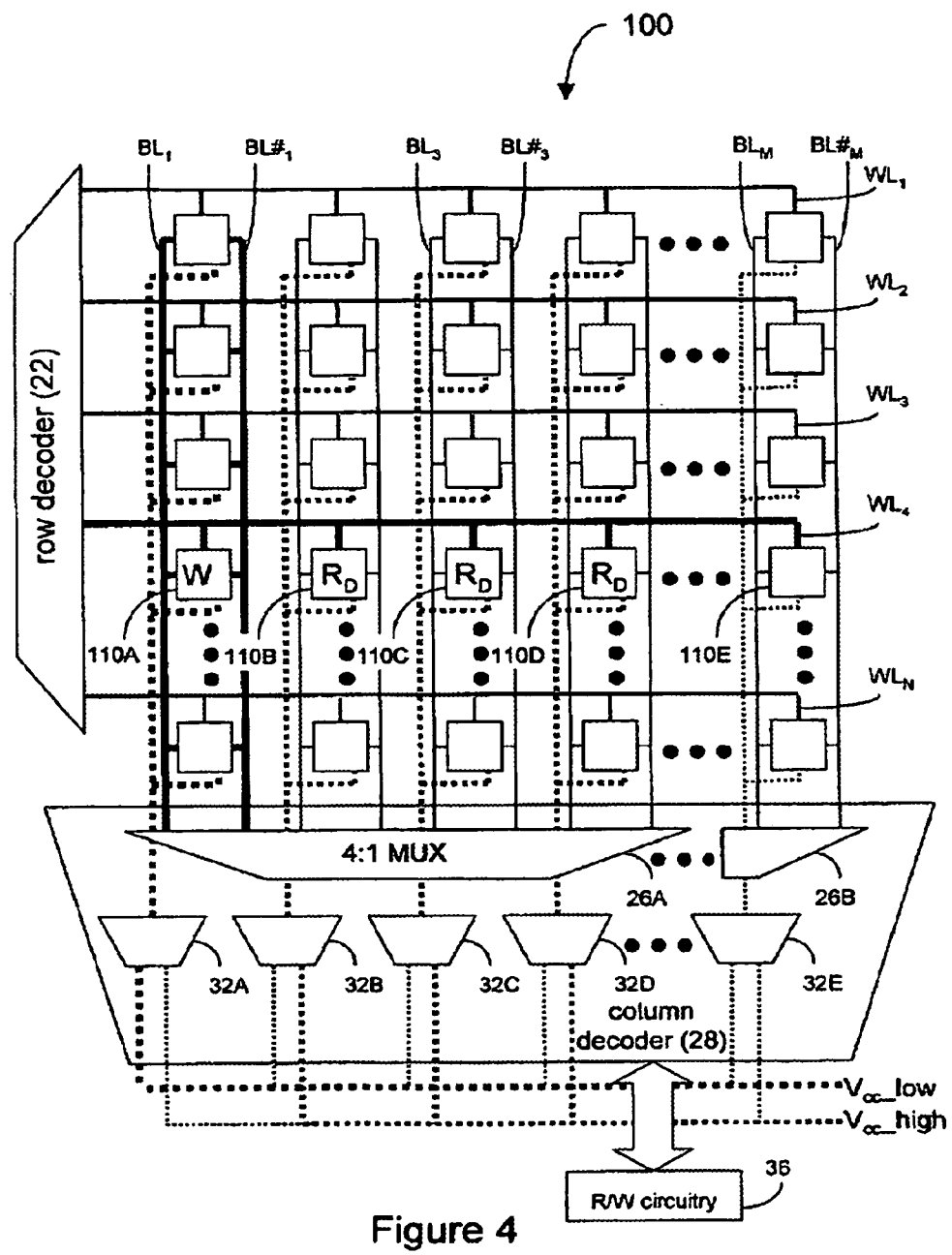
FIG. 4 is a block diagram of a multi-voltage memory array, in which a write operation is performed, according to some embodiments of the invention.

In FIG. 4, a memory array 100 is depicted, according to some embodiments, in which one of two supply voltages, $V_{CC\_}$low and $V_{CC\_}$high, is selected, depending upon whether a read operation or a write operation is being performed. In addition to the 4:1 MUX 26, the column decoder 28 includes a plurality of 2:1 MUXs 32A–32E (collectively, MUXs 32), also known as supply voltage MUXs, one for each bitline pair of the memory array. These 2:1 MUXs 32 supply either a $V_{CC\_}$low voltage or a $V_{CC\_}$high voltage to selected cells 110 within the memory array 100. As in FIG. 2, a row decoder 22 is coupled to the word lines $WL_1$–$WL_N$. Although the input data control, addresses, and data I/O buffers are not depicted in FIG. 4, they are understood to be part of the memory array 100, just as in the prior art memory array 20 of FIG. 2.

Suppose a cell write to the SRAM cell 110A (marked "W") takes place. First, the wordline $WL_4$ is activated by the row decoder 22. The selected wordline is indicated by a thick line in FIG. 4. At this point, any of the cells 110A, 110B, 110C, 110D, or 110E connected to the wordline $WL_4$ is available for the write operation. The 4:1 MUX 26A connects one of four bitline pairs $BL_1/BL\#_1$, $BL_2/BL\#_2$, $BL_3/BL\#_3$, or $BL_4BL\#_4$ to the R/W circuitry 36. For the write to SRAM cell 110A, the 4:1 MUX 26A selects bitline pair $BL_1BL\#_1$ (also indicated using a thick line), in which the bitline $BL_1$ is actively driven low and the complementary bitline $BL\#_1$ is actively driven high. The SRAM cell 110A is thus both activated (wordline $WL_4$) and connected to the R/W circuitry 36 via bitline pair $BL_1/BL\#_1$. The remaining three SRAM cells 110B–110D, while activated, are not connected to the R/W circuitry 36. Thus, only "dummy read" operations (denoted as $R_D$) occur at the SRAM cells 110B–110D. (The SRAM cell 110E is not coupled to the 4:1 MUX 26A; the cell 110E may be selected by the 4:1 MUX 26B for a write operation, or not selected for a "dummy read" operation.)

The supply voltage MUXs 32 provide one of two supply voltages, $V_{CC\_}$low or $V_{CC\_}$high, to the SRAM cells within the memory array 100. Each MUX 32 includes a select line, which determines which supply voltage is selected. Table 1 is a logic table that indicates how the 2:1 MUXs 32 select the supply voltage.

TABLE 1

| Supply Voltage Selection Logic | | |
|---|---|---|
| operation | column selected? | supply voltage |
| read | yes | $V_{cc\_}$high |

TABLE 1-continued

Supply Voltage Selection Logic

| operation | column selected? | supply voltage |
|---|---|---|
| read | no | $V_{cc}$_high |
| write | yes | $V_{cc}$_low |
| write | no | $V_{cc}$_high |

As Table 1 indicates, the lower supply voltage, $V_{CC}$_low, is selected/maintained when a write operation is being performed on the selected column. For all other circumstances, the supply voltage is switched or maintained at the higher voltage, $V_{CC}$_high.

Thus, in FIG. 4, the 2:1 MUX 32A selects the supply voltage $V_{CC}$_low to the SRAM cells 110 in the first column of the memory array. (In FIG. 4, the selected supply voltage line to the 2:1 MUX 32A is thicker than the unselected supply voltage line.) The write operation is performed on the SRAM cell 110A, being the only activated cell in the column.

Since the bitline pairs $BL_2/BL\#_2$, $BL_3/BL\#_3$, and $BL_4/BL\#_4$ were not selected by the 4:1 MUX 26A, the bitline pairs remain driven high. Thus, the deselected 2:1 MUXs 32B–32D provide (or maintain) the supply voltage $V_{CC}$_high to the SRAM cells 10B–10D, which are "dummy read," and thus not processed.

By keeping or switching the supply voltage to the lower voltage during write operations, and simultaneously keeping or switching the supply voltage to the higher voltage during dummy read operations, the SRAM cell that is being written is "flipped" easily, since write margin depends on a lower supply voltage, while the cells under dummy read are stable, that is, their contents are successfully maintained, since read stability benefits from a higher supply voltage.

Figure 5:
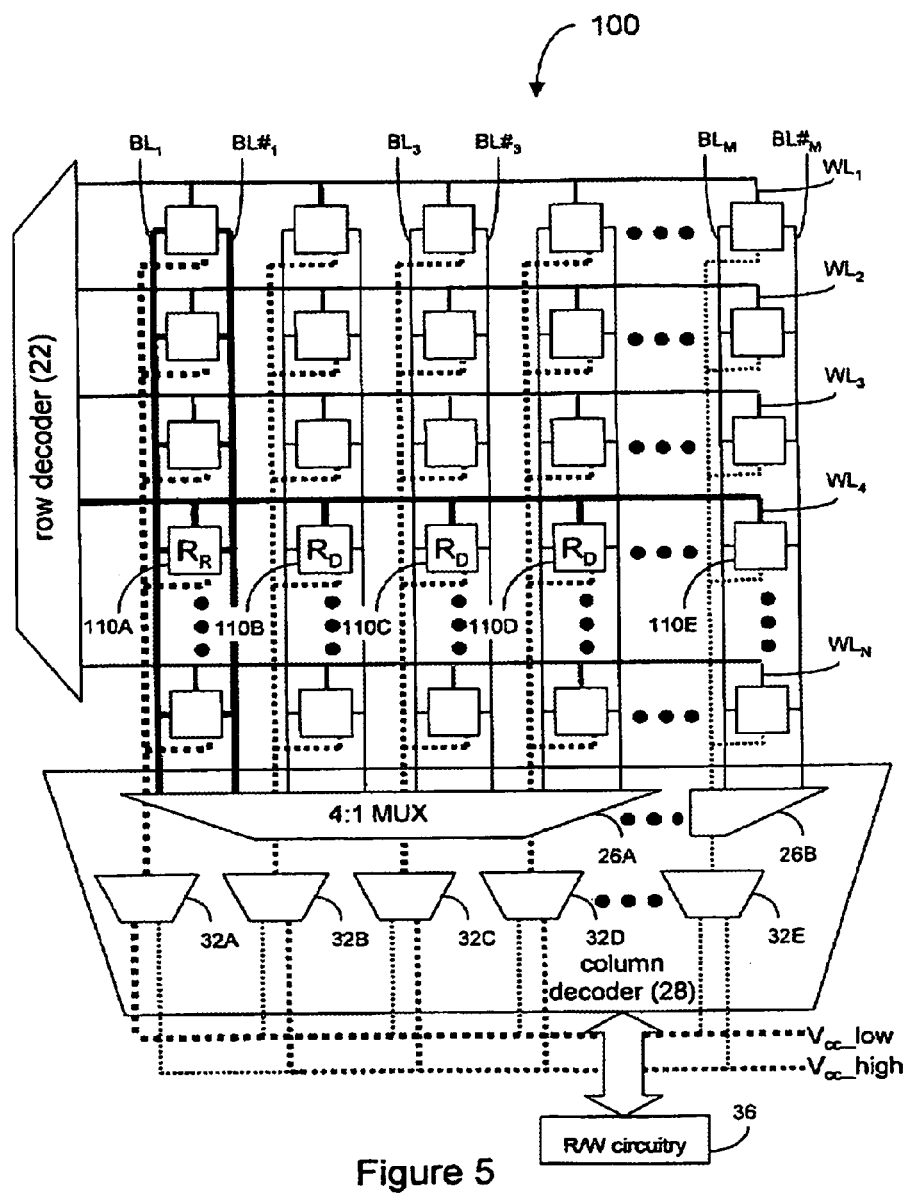
FIG. 5 is a block diagram of the multi-voltage memory array of FIG. 4, in which a read operation is performed, according to some embodiments of the invention.

The multi-voltage scheme is similarly beneficial during read operations. In FIG. 5, a read operation of SRAM cell 10A is performed in the memory array 100. Again, the wordline $WL_4$ is activated by the row decoder 22. The 4:1 MUX selects bitline pair $BL_1BL\#_1$, in which the bitline $BL_1$ is actively driven low and the complementary bitline $BL\#_1$ is actively driven high. The SRAM cell 110A is thus both activated (wordline $WL_4$) and connected to the R/W circuitry (bitline pair $BL_1/BL\#_1$), such that a "real" read (denoted $R_R$), that is, one in which the contents will be sent to R/W circuitry 36, can occur. The remaining three SRAM cells 110B–110D, while activated, are not connected to the R/W circuitry. Thus, only "dummy read" operations (denoted as $R_D$) occur at the SRAM cells 110B–110D.

Referring to Table 1, the 2:1 MUXs 32A–32D all feed the higher supply voltage, $V_{CC}$_high, to the SRAM cells 10A–10D, irrespective of whether the read is real ($R_R$) or dummy ($R_D$). Since the 4:1 MUX 26A connects only the SRAM cell 110A to the R/W circuitry 36, only its contents are processed. Nevertheless, by providing the higher supply voltage, the read stability for all four SRAM cells 110A–110D is maintained.

The supply voltage to the bitlines is thus selectively maintained or switched for each SRAM cell according to whether a read, a dummy read, or a write operation is being performed on the cell. This is true irrespective of whether the relevant wordline $WL_j$ is being supplied with the $V_{CC}$_high supply voltage or with the $V_{CC}$_low supply voltage.

If, in FIG. 4, the wordline $WL_4$ is supplied with the $V_{CC}$_high supply voltage, the access transistors $T_A$ are at $V_{CC}$_high. For cells which are read (or dummy read), i.e., SRAM cells 110B, 110C, and 110D, the supply voltage is at $V_{CC}$_high as well. No improvement in read stability is expected, as all transistors therein are at $V_{CC}$_high. For cells which are written, i.e., SRAM cell 110A, the supply voltage is set to $V_{CC}$_low. The differential between the access transistors and the other transistors within the SRAM cell improves the write margin.

If, instead, the wordline $WL_4$ is supplied with the $V_{CC}$_low supply voltage, the access transistors $T_A$ are at $V_{CC}$_low. For cells which are read (or dummy read), i.e., SRAM cells 110B, 110C, and 110D, the supply voltage is at $V_{CC}$_high. The voltage differential improves the read stability for these cells. For cells which are written, i.e., SRAM cell 110A, the supply voltage is set to $V_{CC}$_low. Since there is no difference between the access transistors and the other transistors within the SRAM cell 110A, no improvement in write margin is to be expected.

The selective activation of supply voltage for each SRAM cell based on whether a read operation (including a dummy read) or a write operation is being performed is not affected by whether the wordline driver is set at $V_{CC}$_high or at $V_{CC}$_low. Thus, the phrase "is switched or maintained" is used throughout this document to indicate that the selected supply voltage is not dependent upon a previous state, but upon the operation to be performed on the SRAM cell.

By keeping or switching the supply voltage to the higher voltage during read operations, and simultaneously keeping or switching the supply voltage to the higher voltage during dummy read operations, the SRAM cell that is being read is stable, since read stability depends on a higher supply voltage, while the cells under dummy read are stable, that is, their contents are successfully maintained for subsequent operations.

The memory array 100 may be part of a processor-based system, such as a personal computer. The availability of multiple supply voltages to the memory array 100 may result in other advantages. For example, the SRAM cells of the memory array 100 may be put into a known state during a power-saving condition, such as standby mode. In some embodiments, all SRAM cells of the memory array are supplied with the voltage $V_{CC}$_high during standby. As the system emerges from the standby mode, cells of the memory array 100 which are subsequently read are already in the $V_{CC}$_high state, and thus demand no cell switching, while cells that are subsequently written to are switched to the $V_{CC}$_low state. Thus, although less cell supply voltage switching presumably takes place immediately following standby mode (since more cells are read from than written to generally), supplying the cells with the higher voltage during the standby mode may also increase cell leakage.

In some other embodiments, all SRAM cells of the memory array are supplied with the lower voltage, $V_{CC}$_low, during standby. As the system emerges from the standby mode, cells of the memory array 100 that are subsequently read are switched to the $V_{CC}$_high state (this includes cells which are dummy read). Cells to be written are already in the $V_{CC}$_low state, and thus require no switching. While this scheme presumably results in more switching (since more cells are typically read than are written to), less leakage of the SRAM cells occurs during the standby mode. For systems which include multiple standby modes, each mode can be characterized by a different default supply voltage, multiplying the number of available states of the memory array 100 during and following standby.

Because the dynamic voltage switching capability of the memory array 100 improves the write margin and read stability, the read stability and write margin performance issues are essentially decoupled from one another. Thus, using this design approach, further optimizations of the SRAM cell can be made, such as to minimize the cell area. As one example, instead of solely relying on sizing up the pull-down ($T_D$) or pull-up ($T_U$) transistors in order to optimize the read operation of the SRAM cell, the $T_U$ and $T_D$ transistors can be kept small. Instead, a higher supply voltage can achieve read stability. Thus, smaller cell areas can be achieved using the multi-voltage scheme described above.

Figure 6:
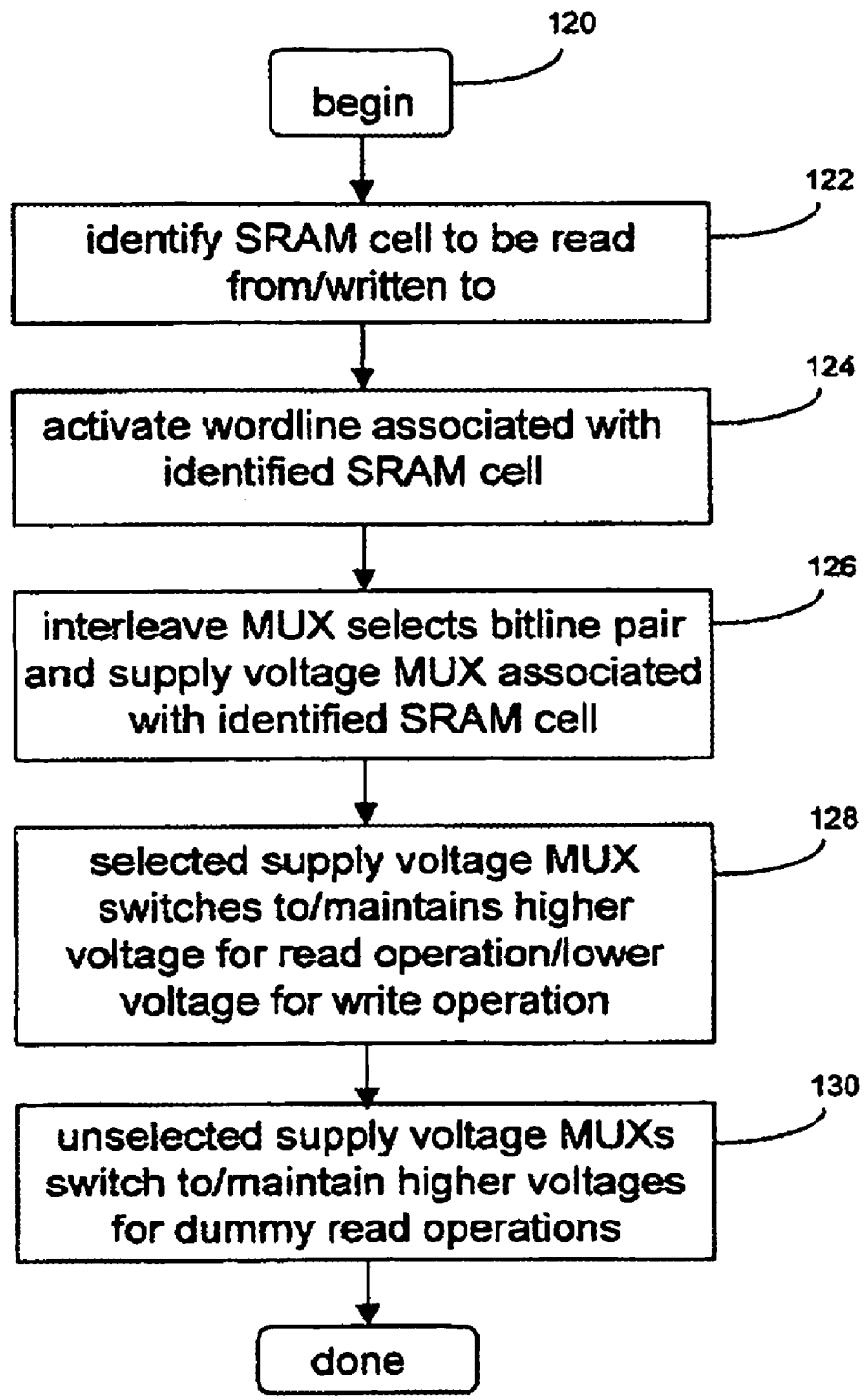
FIG. 6 is a flow diagram showing operation of the multi-voltage memory array of FIG. 4 during read/write operations, according to some embodiments of the invention.

In FIG. 6, a flow diagram 120 depicts a method for selectively switching the voltage to SRAM cells 10 of the memory array 100, according to some embodiments. First, the SRAM cell to be read from or written to is identified (block 122). The corresponding wordline is thus activated (block 124) by the row decoder of the memory array. The interleaving MUX selects the bitline pair corresponding to the identified SRAM cell (block 126). Further, one of the supply voltage MUXs associated with the interleaving MUX is also selected. The selected supply voltage MUX switches to or maintains a higher voltage to the identified SRAM cell if a read operation is to be performed. If a write operation is to be performed, the selected supply voltage MUX switches to or maintains a lower voltage to the identified SRAM cell (block 128), thus ensuring a write margin for the cell. The other supply voltage MUXs associated with the interleaving MUX (i.e., the unselected ones) switch to or maintain a higher voltage to the other SRAM cells (block 130), since the unselected cells are dummy read, thus maintaining read stability for those cells.

While the invention has been described with respect to a limited number of embodiments, those skilled in the art will appreciate numerous modifications and variations therefrom. It is intended that the appended claims cover all such modifications and variations as fall within the true spirit and scope of the invention.

We claim:

1. A memory array, comprising:
   a plurality of cells arranged in a matrix, the matrix having N rows and M columns, N and M being integer values, wherein each cell is capable of storing a bit;
   a first multiplexer associated with a first column of the M columns, the first multiplexer to supply either a first voltage or a second voltage as a supplied voltage to the first column, wherein the supplied voltage reaches each cell in the first column;
   a second multiplexer associated with a second column of the M columns, the second multiplexer to supply either the first voltage or the second voltage to the second column, wherein the supplied voltage reaches each cell in the second column;
   wherein the first multiplexer supplies the first voltage to the first column of cells while the second multiplexer simultaneously supplies the second voltage to the second column of cells.

2. The memory array of claim 1, further comprising:
   a row decoder for activating a wordline of a plurality of wordlines, each row of the matrix being associated with a single wordline;
   wherein a first cell in the first column of cells and a second cell in the second column of cells are activated for read or write operations when the wordline is activated.

3. The memory array of claim 2, further comprising:
   a column decoder coupled between a plurality of bitline pairs and a read/write circuit, each bitline pair being associated with one of the M columns, wherein the column decoder couples a first bitline pair associated with the first column of cells to the read/write circuit.

4. The memory array of claim 3, wherein the first voltage is lower than the second voltage and a write operation is performed on the first cell while a dummy read operation is performed on the second cell.

5. The memory array of claim 3, wherein the first voltage is identical to the second voltage and a read operation is performed on the first cell while a dummy read operation is performed on the second cell.

6. The memory array of claim 3, the column decoder further comprising an interleaving multiplexer, wherein the interleaving multiplexer selects a bitline pair from a group of bitline pairs, the group being smaller than the plurality of bitline pairs, wherein activated cells connected to any unselected bitline pairs in the group are dummy read.

7. A method, comprising:
   activating a wordline associated with a first memory cell, the wordline also being associated with a second memory cell;
   supplying a first voltage to the first memory cell, the first memory cell being in a first column, the first voltage also being supplied to other memory cells in the first column; and
   simultaneously supplying a second voltage to the second memory cell, the second memory cell being in a second column, the second voltage also being supplied to other memory cells in the second column.

8. The method of claim 7, further comprising:
   activating a bitline pair associated with the first memory cell, the bitline pair connecting the first memory cell with read/write circuitry; and
   performing a write operation to the first memory cell.

9. The method of claim 8, wherein the first voltage is lower than the second voltage and the second memory cell is dummy read.

10. The method of claim 7, further comprising:
    activating a bitline pair associated with the first memory cell, the bitline pair connecting the first memory cell with read/write circuitry; and
    performing a read operation from the first memory cell.

11. The method of claim 10, wherein the first voltage is lower than the second voltage and the second memory cell is dummy read.

12. A cell arranged in a memory array, the memory array comprising rows and columns of cells, the cell being in a column, the cell comprising:
    first and second access transistors each having gate terminals coupled to a wordline, the first access transistor being coupled to a bitline and the second access transistor being coupled to a complementary bitline;
    first and second pull-down transistors each having source terminals coupled to ground;
    first and second pull-up transistors each having source terminals coupled to a two-to-one multiplexer, wherein a first pull-up transistor drain is coupled to a first pull-down transistor drain and to a second pull-down transistor gate and a second pull-up transistor drain is coupled to a second pull-down transistor drain and to a first pull-down transistor gate;
    wherein the two-to-one multiplexer supplies a first voltage to the column when a write to the cell occurs and supplies a second voltage to the column when a read of the cell occurs.

13. The cell of claim 12, wherein the first pull-up transistor drain is further coupled to a second pull-up transistor gate and the second pull-up transistor drain is further coupled to a first pull-up transistor gate.

14. The cell of claim 13, wherein the first voltage is lower than the second voltage.

15. A memory array, comprising:
   a plurality of cells arranged in rows and columns, wherein each cell in a row is coupled to a dedicated wordline and each cell in a column is coupled to a dedicated bitline pair;
   a first multiplexer to selectively supply one of two supply voltages to a first column, the first column including a selected cell;
   a second multiplexer to selectively supply one of the two supply voltages to a second column, the second column including a non-selected cell, wherein the selected cell and the non-selected cell share a wordline;
   wherein the first multiplexer supplies the first voltage to the first column of cells when an operation is being performed to the selected cell while the second multiplexer simultaneously supplies the second voltage to the second column of cells.

16. The memory array of claim 15, wherein the operation is a write operation.

17. The memory array of claim 16, wherein a dummy read of the non-selected cell is performed simultaneously during the write operation of the selected cell.

18. The memory array of claim 16, wherein the first voltage is lower than the second voltage.

19. The memory array of claim 15, wherein the operation is a read operation.

20. The memory array of claim 19, wherein a dummy read of the non-selected cell is performed simultaneously during the read operation of the selected cell.

* * * * *